(12) United States Patent
Kim et al.

(10) Patent No.: US 8,541,806 B2
(45) Date of Patent: Sep. 24, 2013

(54) LIGHT EMITTING DIODE HAVING ELECTRODE PADS

(75) Inventors: Kyoung Wan Kim, Ansan-si (KR); Jeong Hee Yang, Ansan-si (KR); Yeo Jin Yoon, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 358 days.

(21) Appl. No.: 12/963,921

(22) Filed: Dec. 9, 2010

(65) Prior Publication Data

US 2011/0140160 A1    Jun. 16, 2011

(30) Foreign Application Priority Data

Dec. 14, 2009   (KR) .................. 10-2009-0123862

(51) Int. Cl.
*H01L 33/00*    (2010.01)
(52) U.S. Cl.
USPC .................. 257/99; 257/98; 257/E33.065
(58) Field of Classification Search
USPC ........ 257/79, 89, 99, 100, E33.064, E33.065; 438/29, 72
See application file for complete search history.

(56) References Cited

U.S. PATENT DOCUMENTS

| 6,650,018 B1 | 11/2003 | Zhao et al. | |
| 2007/0228388 A1* | 10/2007 | Ko et al. | 257/79 |
| 2008/0210972 A1* | 9/2008 | Ko et al. | 257/99 |

FOREIGN PATENT DOCUMENTS

| CN | 101431141 | 5/2009 |
| KR | 10-0809220 | 2/2008 |
| TW | 200840089 | 10/2008 |

OTHER PUBLICATIONS

Preliminary Notice of First Office Action issued on Apr. 24, 2013 in Taiwanese Patent Application No. 099140424.
Search Report completion dated on Apr. 22, 2013 in in Taiwanese Patent Application No. 099140424.

* cited by examiner

*Primary Examiner* — Chuong A Luu
*Assistant Examiner* — Nga Doan
(74) *Attorney, Agent, or Firm* — H. C. Park & Associates, PLC

(57) ABSTRACT

The present invention relates to a light emitting diode including a substrate, a first conductive type semiconductor layer arranged on the substrate, a second conductive type semiconductor layer arranged on the first conductive type semiconductor layer, an active layer disposed between the first conductive type semiconductor layer and the second conductive type semiconductor layer, a first electrode pad electrically connected to the first conductive type semiconductor layer, a second electrode pad arranged on the first conductive type semiconductor layer, and an insulation layer disposed between the first conductive type semiconductor layer and the second electrode pad, the insulation layer insulating the second electrode pad from the first conductive type semiconductor layer. At least one upper extension may be electrically connected to the second electrode pad, the at least one upper extension being electrically connected to the second conductive type semiconductor layer.

17 Claims, 4 Drawing Sheets

LIGHT EMITTING DIODE HAVING ELECTRODE PADS

CROSS-REFERENCE TO RELATED APPLICATION

This application claims priority from and the benefit of Korean Patent Application No. 10-2009-0123862, filed on Dec. 14, 2009, which is hereby incorporated by reference for all purposes as if fully set forth herein.

BACKGROUND OF THE INVENTION

1. Field of the Invention

Exemplary embodiments of the invention relate to a light emitting diode and, more particularly, to a light emitting diode having electrode pads.

2. Description of the Background

Gallium nitride (GaN) based light emitting diodes (LEDs) have been used in a wide range of applications including full color LED displays, LED traffic signals, and white LEDs.

The GaN-based light emitting diode may be generally formed by growing epitaxial layers on a substrate, for example, a sapphire substrate, and includes an N-type semiconductor layer, a P-type semiconductor layer, and an active layer disposed between the N-type semiconductor layer and the P-type semiconductor layer. Further, an N electrode pad is formed on the N-type semiconductor layer and a P electrode pad is formed on the P-type semiconductor layer. The light emitting diode is electrically connected to and operated by an external power source through these electrode pads. Here, electric current is directed from the P-electrode pad to the N-electrode pad through the semiconductor layers.

Generally, since the P-type semiconductor layer may have a high resistivity, electric current may not be evenly distributed within the P-type semiconductor layer, but may be concentrated on a portion of the P-type semiconductor layer where the P-electrode pad is formed. Electric current may be concentrated on and flow through edges of the semiconductor layers. This may be referred to as current crowding, and may lead to a reduction in light emitting area, thereby deteriorating luminous efficacy of a source. A transparent electrode layer having a low resistivity may be formed on the P-type semiconductor layer to enhance current spreading. In this structure, electric current supplied from the P-electrode pad may be dispersed by the transparent electrode layer before entering the P-type semiconductor layer, thereby increasing a light emitting area of the LED.

However, since the transparent electrode layer may tend to absorb light, the thickness of the transparent electrode layer is limited, thereby providing limited current spreading. In particular, for a large LED having an area of about 1 mm² or more, there is a limitation on current spreading through the transparent electrode layer.

To facilitate current spreading within a LED, extensions extending from the electrode pads may be used. For example, U.S. Pat. No. 6,650,018 discloses an LED that includes a plurality of extensions extending in opposite directions from electrode pads to enhance current spreading. Although the use of extensions may enhance current spreading over a wide region of the LED, current crowding may still occur at portions of the LEDs where the electrode pads are formed.

Moreover, as the size of the LED increases, the likelihood of a defect being present in the light emitting diode may increase. Defects such as threading dislocations, pin-holes, etc. provide a path through which electric current may flow rapidly, thereby disturbing uniform current spreading in the LED.

SUMMARY OF THE INVENTION

Exemplary embodiments of the invention provide a light emitting diode that reduces current crowding near an electrode pad.

Exemplary embodiments of the present invention also provide a light emitting diode that improves uniform current spreading over a wide area.

Additional features of the invention will be set forth in the description which follows, and in part will be apparent from the description, or may be learned by practice of the invention.

An exemplary embodiment of the present invention discloses a light emitting diode including a substrate, a first conductive type semiconductor layer arranged on the substrate, a second conductive type semiconductor layer arranged on the first conductive type semiconductor layer, an active layer disposed between the first conductive type semiconductor layer and the second conductive type semiconductor layer, a first electrode pad electrically connected to the first conductive type semiconductor layer, a second electrode pad arranged on the first conductive type semiconductor layer, and an insulation layer disposed between the first conductive type semiconductor layer and the second electrode pad, the insulation layer insulating the second electrode pad from the first conductive type semiconductor layer. At least one upper extension may be electrically connected to the second electrode pad, the at least one upper extension being electrically connected to the second conductive type semiconductor layer.

An exemplary embodiment of the present invention also discloses a light emitting diode including a substrate, a first conductive type a first conductive type semiconductor layer arranged on the substrate, a second conductive type semiconductor layer arranged on the first conductive type semiconductor layer, an active layer disposed between the first conductive type semiconductor layer and the second conductive type semiconductor layer, a first electrode pad arranged on the first conductive type semiconductor layer, a second electrode pad arranged on the first conductive type semiconductor layer, at least one upper extension arranged on the second conductive type semiconductor layer and connected to the second electrode pad, and at least one lower extension arranged on the first conductive type semiconductor layer and connected to the first electrode pad, wherein the second electrode pad is insulated from the first semiconductor layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
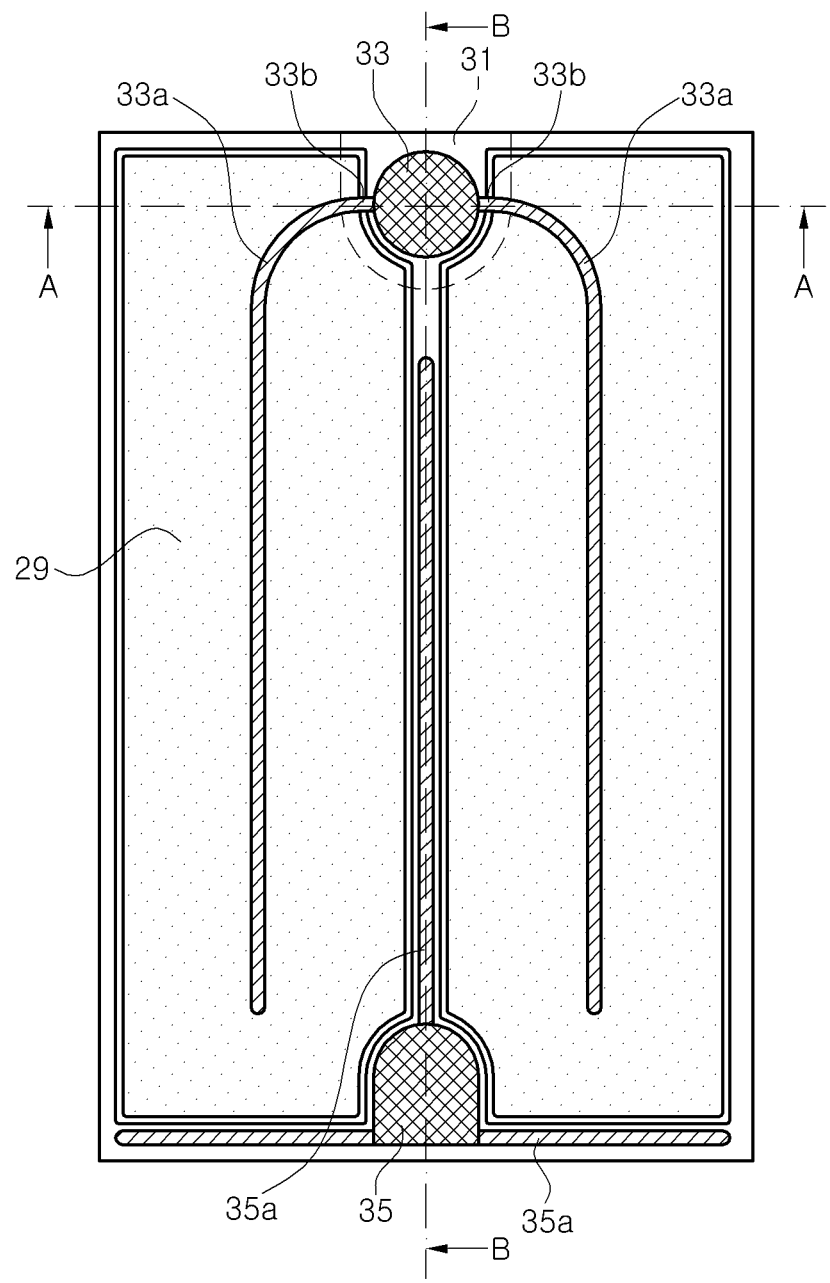
FIG. 1 is a plan view of a light emitting diode according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough and will fully convey the scope of the invention to those skilled in the art. In the drawings, the sizes and relative sizes of layers and regions may be exaggerated for clarity. Like reference numerals in the drawings denote like elements.

It will be understood that when an element such as a layer, film, region or substrate is referred to as being "on" another element, it can be directly on the other element or intervening elements may also be present. In contrast, when an element is referred to as being "directly on" another element, there are no intervening elements present.

Figure 2:
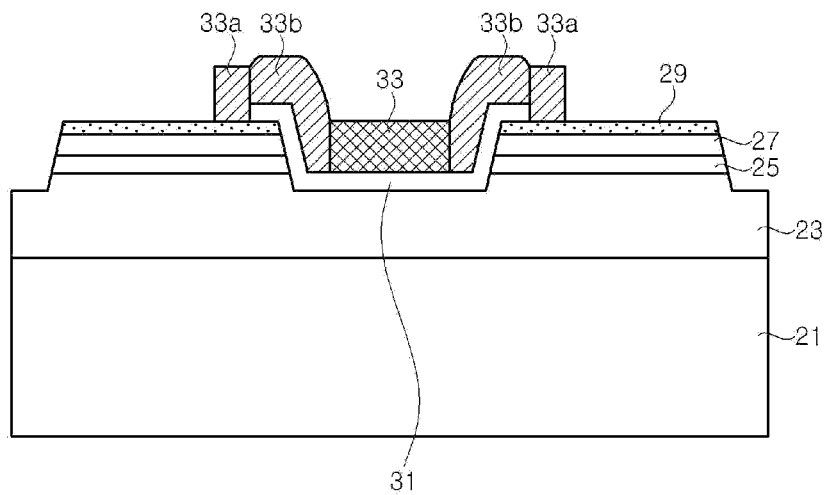
FIG. 2 is a cross-sectional view taken along line A-A of FIG. 1.
Figure 3:
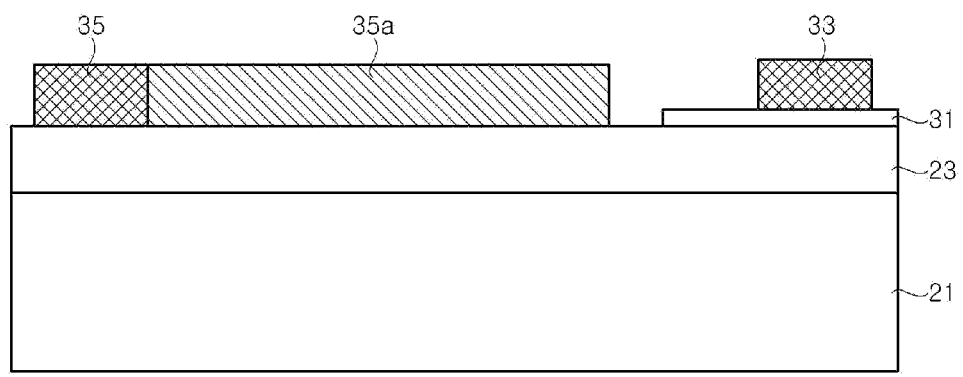
FIG. 3 is a cross-sectional view taken along line B-B of FIG. 1.

FIG. 1 is a plan view of a light emitting diode according to an exemplary embodiment of the present invention, FIG. 2 is a cross-sectional view taken along line A-A of FIG. 1, and FIG. 3 is a cross-sectional view taken along line B-B of FIG. 1.

Referring to FIG. 1, FIG. 2, and FIG. 3, the light emitting diode includes a substrate 21, a first conductive type semiconductor layer 23, an active layer 25, a second conductive type semiconductor layer 27, an insulation layer 31, first electrode pad 35, second electrode pad 33, and upper extensions 33a. The light emitting diode may further include connecting portions 33b, a transparent electrode layer 29, and lower extensions 35a. The substrate 11 may be a sapphire substrate, but is not limited thereto.

The first conductive type semiconductor layer 23 is located on the substrate 21 and the second conductive type semiconductor layer 25 is located on the first conductive type semiconductor layer 27 with the active layer 25 disposed between the first and second conductive type semiconductor layers 23 and 27. The first conductive type semiconductor layer 23, active layer 25, and second conductive type semiconductor layer 27 may be formed of, but are not limited to, a GaN-based compound semiconductor material such as (Al, In, Ga)N. The constituent elements and composition of the active layer 25 are determined to emit light having a desired wavelength, for example, ultraviolet or blue light. The first conductive type semiconductor layer 23 may be an n-type nitride semiconductor layer and the second conductive type semiconductor layer 27 may be a p-type nitride semiconductor layer, or vice versa.

The first conductive type semiconductor layer 23 and/or the second conductive type semiconductor layer 27 may have a single layer structure, or alternatively, a multilayer structure. Further, the active layer 25 may have a single quantum well structure or a multi-quantum well structure. The light emitting diode may further include a buffer layer (not shown) disposed between the substrate 21 and the first conductive type semiconductor layer 23. These first conductive type semiconductor layer 23, the active layer 25, and the second conductive type semiconductor layer 27 may be formed by a metal-organic chemical vapor deposition (MOCVD) technique or molecular beam epitaxy (MBE) technique.

A transparent electrode layer 29 may be formed on the second conductive type semiconductor layer 27. The transparent electrode layer 29 may be formed of indium tin oxide (ITO) or Ni/Au, and form an ohmic contact with the second conductive type semiconductor layer 27.

The second conductive type semiconductor layer 27 and the active layer 25 may be subjected to a process to expose a region(s) of the first conductive type semiconductor layer 23 via photolithography and etching. Such a process is generally known as a mesa-etching. The mesa etching may provide divided light emitting regions as shown in FIG. 1 and FIG. 2. Although, in the present exemplary embodiment, the light emitting diode has two light emitting regions that are isolated from each other, the light emitting diode may have more than two separate light emitting regions. Further, the mesa-etching may be performed to form inclined side surfaces which have a degree of inclination in the range of 30-70 degrees.

The first electrode pad 35 and the second electrode pad 33 are located on the first conductive type semiconductor layer 23, which is exposed through the mesa etching. The first electrode pad 35 is electrically connected to the first conductive type semiconductor layer 23. The second electrode pad 33 is insulated from the first conductive type semiconductor layer 23 by the insulation layer 31. The first electrode pad 35 and the second electrode pad 33 are bonding pads for bonding wires and may have an area sufficiently wide for wire bonding. The first electrode pad 35 and the second electrode pad 33 may be formed on the exposed region(s) of the first conductive type semiconductor layer 23, but are not limited thereto.

The insulation layer 31 is disposed between the second electrode pad 33 and the first conductive type semiconductor layer 23 to insulate the second electrode pad 33 from the first conductive type semiconductor layer 23. Further, the insulation layer 31 may cover the side surfaces of the second conductive type semiconductor layer 27 and the active layer 25, which are exposed by the mesa etching. The insulation layer 31 may extend to an upper surface of the second conductive type semiconductor layer 27 such that an edge of the insulation layer 31 overlaps the second conductive type semiconductor layer 27 or the transparent electrode layer 29. The insulation layer 31 may be a single layer structure (as shown in the Figures), or a multilayered structure. The insulation layer 31 may include, for example, $SiO_2$ and/or $Si_3N_4$. Alternatively, the insulation layer 31 may be a multilayered dielectric reflector (such as a distributed Bragg reflector), including alternately stacked layers of $SiO_2$ and $TiO_2$. The multilayered dielectric reflector can reflect light incident on the second electrode pad 33, thus decreasing light absorption by the second electrode pad 33.

The upper extensions 33a are located on the second conductive type semiconductor layer 27 (or transparent electrode layer 29). The upper extensions 33a may be connected to the second electrode pad 33 via connecting portions 33b, respectively, and may be electrically connected to the second conductive type semiconductor layer 27. The upper extensions 33a are disposed to allow uniform current spreading on the second conductive type semiconductor layer 27. The connecting portions 33b are separated from the side surfaces of the transparent electrode layer 29, the second conductive type semiconductor layer 27, and the active layer 25 by the insulation layer 31.

At least one lower extension 35a may extend from the first electrode pad 35. The lower extension 35a is located on the first conductive type semiconductor layer 23 and electrically connected thereto. As shown in the figures, the lower extension 35a may be located between the divided light emitting regions, but is not limited thereto. Alternatively, the lower extension 35a may be located outside the light emitting regions.

As shown in the present exemplary embodiment as well as the following exemplary embodiments, the lower extension 35a and the upper extension 33a may be arranged in specific patterns to help improve current spreading. For example, in the present exemplary embodiment, having two upper extensions 33a extend from the second electrode pad 33 along each of the divided light emitting regions may improve current spreading while not requiring multiple electrode pads on the light emitting diode to connect to the upper extensions 33a. In the various exemplary embodiments, the lower extension and upper extension arrangement may likewise improve current spreading in divided light emitting regions while avoiding a requirement for multiple electrode pads on the single substrate.

The second electrode pad 33, the first electrode pad 35, the upper extensions 33a, the connecting portions 33b, and the lower extension 35a may be formed of, but are not limited to, the same material, for example, Cr/Au by the same process. Alternatively, the upper extensions 33a and the second electrode pad 33 may be formed of different materials by different processes.

In the present exemplary embodiment, the divided light emitting regions have a symmetrical structure relative to a line, for example, a cut line B-B, which is located between the first electrode pad 35 and the second electrode pad 33. The upper extensions 33a are also disposed in a symmetrical structure, so that the light emitting regions may exhibit the same radiation characteristics. Accordingly, when a light emitting region is divided into two light emitting regions in a single light emitting diode, a process of packaging the light emitting diode may be further simplified compared to using two light emitting diodes connected in parallel to each other. Furthermore, the divided light emitting regions may relieve current crowding caused by defects and may improve light extraction efficiency through formation of the inclined side surfaces by mesa etching.

Figure 4:
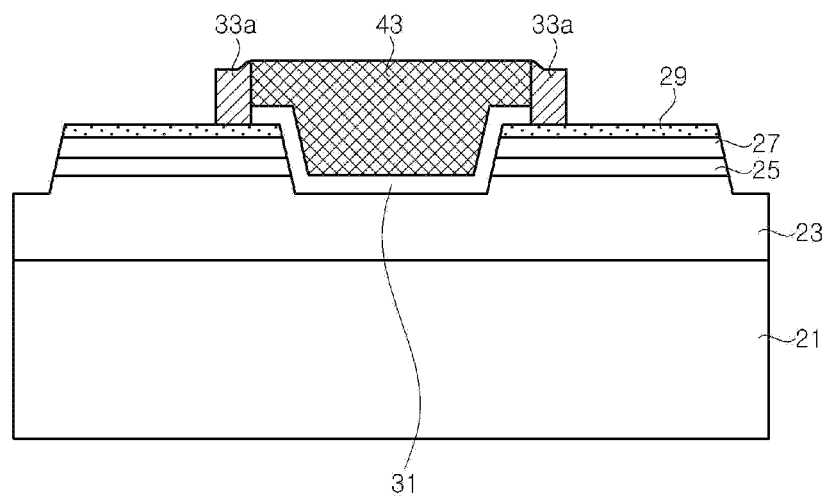
FIG. 4 is a cross-sectional view of a light emitting diode according to an exemplary embodiment of the present invention.

FIG. 4 shows a cross-sectional view of a light emitting diode according to an exemplary embodiment of the present invention.

Referring to FIG. 4, the light emitting diode of the present exemplary embodiment is generally similar to the light emitting diode described with reference to FIG. 1, FIG. 2, and FIG. 3. In the light emitting diode of the present exemplary embodiment, however, a portion of a second electrode pad 43 is located on a second conductive type semiconductor layer 27.

Specifically, the second electrode pad 43 is located on a first conductive type semiconductor layer 23 exposed through a mesa etching process and a portion of the second electrode pad 43 is located on the second conductive type semiconductor layer 27. The second electrode pad 43 is insulated not only from the first conductive type semiconductor layer 23 but also from the transparent electrode layer 29, the second conductive type semiconductor layer 27, and the active layer 25 by an insulation layer 31. Extensions 33a extend from the second electrode pad 43.

In the present exemplary embodiment, the second electrode pad 43 is separated from the semiconductor layers by the insulation layer 31, which may thereby prevent current crowding around the second electrode pad 43. Furthermore, in the present exemplary embodiment, an area subjected to mesa etching may be decreased compared to the previous exemplary embodiment, thereby increasing the light emitting region.

Figure 5:
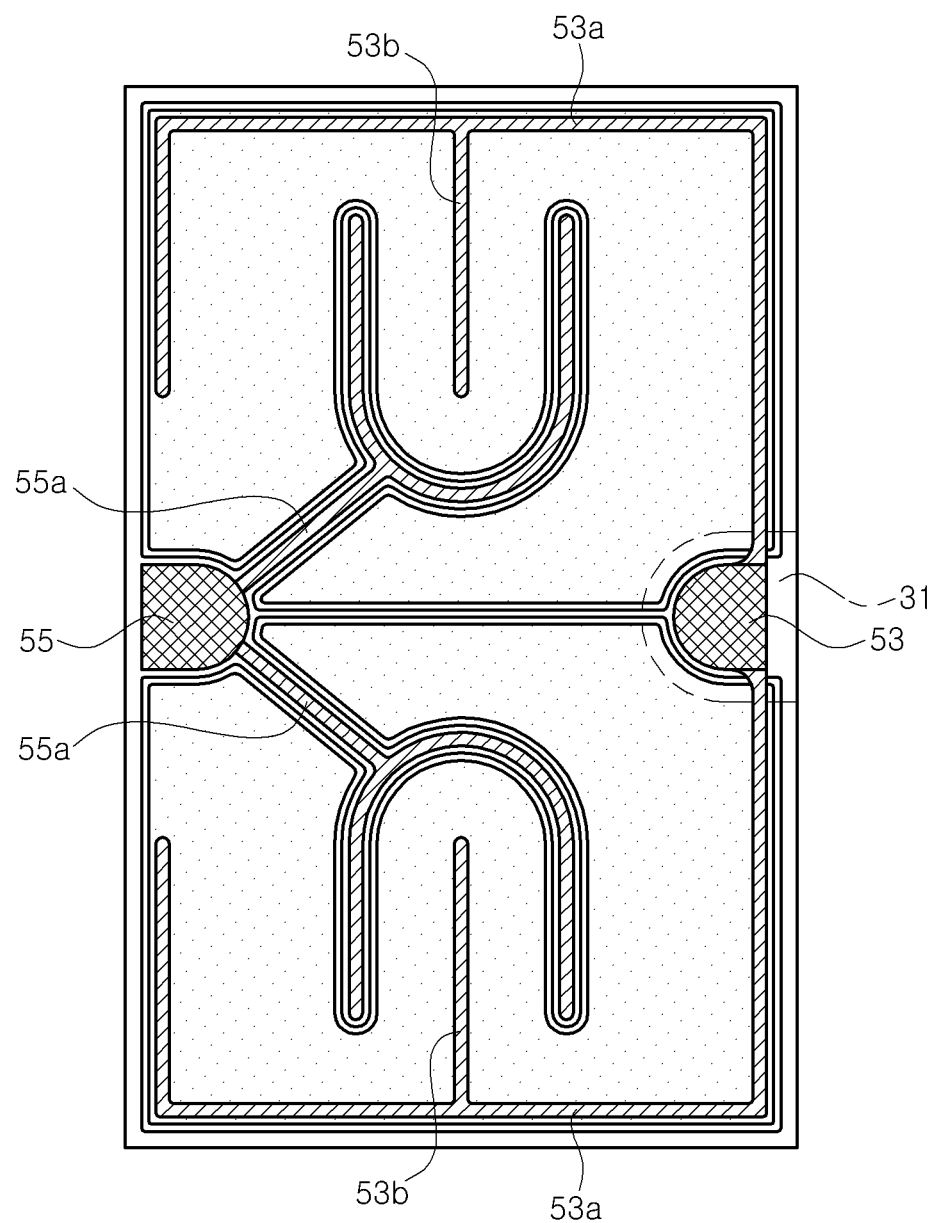
FIG. 5 is a plan view of a light emitting diode according to an exemplary embodiment of the present invention.

FIG. 5 is a plan view of a light emitting diode according to an exemplary embodiment of the present invention.

In the exemplary embodiment shown in FIG. 1, the first electrode pad 35 and the second electrode pad 33 are disposed along a major axis of the light emitting diode, and the light emitting regions are divided from each other along the major axis of the light emitting diode. On the contrary, the light emitting diode according to the present exemplary embodiment includes a first electrode pad 55 and a second electrode pads 53 disposed along a minor axis of the light emitting diode and light emitting regions divided from each other along the minor axis of the light emitting diode. Further, the divided light emitting regions are disposed in a symmetrical structure and upper extensions 53a and lower extensions 55a are also disposed in a symmetrical structure.

In the present exemplary embodiment, the upper extensions 53a extend along a periphery of the light emitting diode to surround the light emitting diode, and each of the upper extensions 53a has an extension 53b extending inward from the periphery of the light emitting diode. The lower extensions 55a extend from an inner side of the light emitting diode toward the outside of the light emitting diode. Each of the lower extensions 55a may be bifurcated to surround an extension 53b in each light emitting region. In the present exemplary embodiment, the ends of lower extensions 55a have a shape which resembles a "U", but is not limited thereto.

Figure 6:
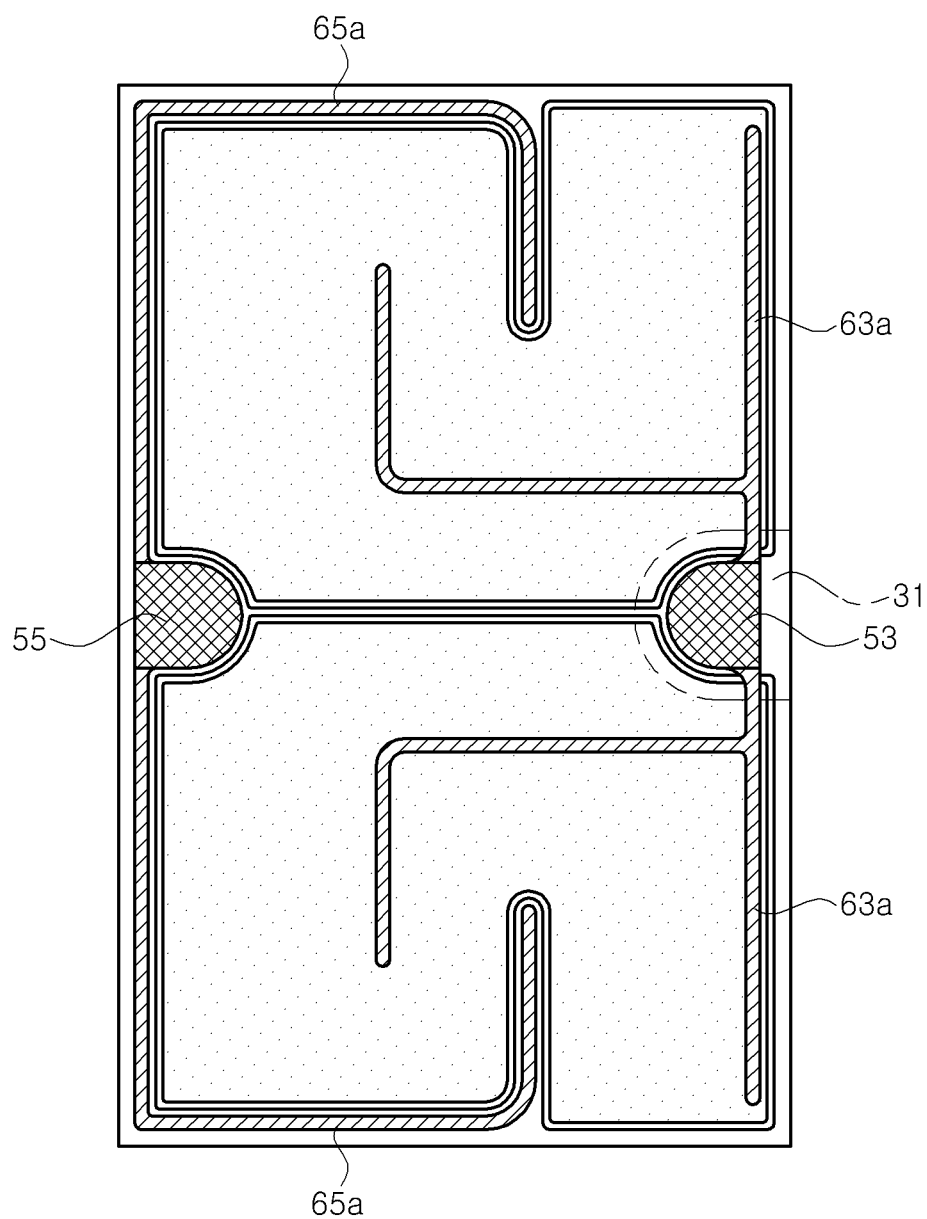
FIG. 6 is a plan view of a light emitting diode according to an exemplary embodiment of the present invention.

FIG. 6 is a plan view of a light emitting diode according to an exemplary embodiment of the present invention.

Referring to FIG. 6, the light emitting diode of the present exemplary embodiment is generally similar to the light emitting diode described with reference to FIG. 5. In the light emitting diode of the present exemplary embodiment, however, lower extensions 65a and upper extensions 63a have different arrangements than the upper extensions 53a and lower extensions 55a.

Specifically, the lower extensions 65a extend along a periphery of the light emitting diode first and then extend into the light emitting regions, and each of the upper extensions 63a includes two extension portions disposed on one of the light emitting regions, and these two extension portions surround the lower extension 65a extending into the light emitting region. That is, in the present exemplary embodiment, a first portion of each upper extension 63a extends along a periphery of the light emitting region, and a second portion of each upper extension 63a extends into the light emitting region after branching off from the first portion of the upper extension 63a. A part of the second portion of the upper extension 63a extending into the light emitting region is substantially perpendicular to the lower extension 65a extending into the light emitting region, and another part of the second portion of the upper extension 63a extending into the light emitting region is substantially parallel to the lower extension 65a extending into the light emitting region. Therefore, the two portions of the upper extension 63a may be referred to as surrounding the lower extension 65a extending into the light emitting region. This arrangement may improve current spreading in the divided light emitting regions in the light emitting diode.

Although exemplary embodiments are described above to illustrate the present invention, the light emitting diode is described as being divided into two light emitting regions, but alternative embodiments may have the light emitting diode being divided into more than two light emitting regions. In some embodiments, the light emitting regions may not be completely divided from each other. In other words, portions of the light emitting regions may be connected to each other.

Although the invention has been illustrated with reference to some exemplary embodiments in conjunction with the drawings, it will be apparent to those skilled in the art that various modifications and changes can be made in the invention without departing from the spirit and scope of the invention. Therefore, it should be understood that the exemplary embodiments are provided by way of illustration only and are given to provide complete disclosure of the invention and to provide thorough understanding of the invention to those skilled in the art. Thus, it is intended that the invention covers the modifications and variations of this invention provided they come within the scope of the appended claims and their equivalents.

What is claimed is:

1. A light emitting diode, comprising:
   a substrate;
   a first conductive type semiconductor layer arranged on the substrate;
   a second conductive type semiconductor layer arranged on the first conductive type semiconductor layer;
   an active layer disposed between the first conductive type semiconductor layer and the second conductive type semiconductor layer;
   a first electrode pad electrically connected to the first conductive type semiconductor layer;
   a second electrode pad arranged on the first conductive type semiconductor layer;
   an insulation layer disposed between the first conductive type semiconductor layer and the second electrode pad, the insulation layer insulating the second electrode pad from the first conductive type semiconductor layer; and
   at least one upper extension connected to the second electrode pad, the at least one upper extension being electrically connected to the second conductive type semiconductor layer.

2. The light emitting diode of claim 1, wherein the first conductive type semiconductor layer comprises an n-type nitride semiconductor layer, and the second conductive type semiconductor layer comprises a p-type nitride semiconductor layer.

3. The light emitting diode of claim 2, further comprising:
   a transparent electrode layer arranged on the p-type nitride semiconductor layer,
   wherein the upper extension is arranged on the transparent electrode layer.

4. The light emitting diode of claim 1, wherein the first conductive type semiconductor layer comprises at least one exposed region,
   the second conductive type semiconductor layer and the active layer are partially removed and expose the at least one exposed region, and
   the second electrode pad is arranged on the exposed region of the first conductive type semiconductor layer.

5. The light emitting diode of claim 4, further comprising:
   a connecting portion connecting the upper extension to the second electrode pad,
   wherein side surfaces of the second conductive type semiconductor layer and the active layer are insulated from the connecting portion by the insulation layer.

6. The light emitting diode of claim 4, wherein the insulation layer extends to and is disposed on an upper surface of the second conductive type semiconductor layer.

7. The light emitting diode of claim 6, wherein at least a portion of the second electrode pad is arranged on the upper surface of the second conductive type semiconductor layer, and the second electrode pad and the second conductive type semiconductor layer are separated from each other by at least the insulation layer.

8. The light emitting diode of claim 1, wherein the second conductive type semiconductor layer and the active layer are divided to define at least two light emitting regions, and the at least one upper extension is arranged on one of the at least two light emitting regions.

9. The light emitting diode of claim 8, wherein the at least two light emitting regions are arranged symmetrically with respect to an imaginary line through the first electrode pad and the second electrode pad.

10. The light emitting diode of claim 8, further comprising:
    at least one lower extension connected to the first electrode pad,
    wherein a first lower extension of the at least one lower extension is arranged between a first light emitting region and a second light emitting region of the at least two light emitting regions.

11. A light emitting diode, comprising:
    a substrate;
    a first conductive type semiconductor layer arranged on the substrate;
    a second conductive type semiconductor layer arranged on the first conductive type semiconductor layer;
    an active layer disposed between the first conductive type semiconductor layer and the second conductive type semiconductor layer;
    a first electrode pad arranged on the first conductive type semiconductor layer;
    a second electrode pad arranged on the first conductive type semiconductor layer;
    at least one upper extension arranged on the second conductive type semiconductor layer and connected to the second electrode pad; and
    at least one lower extension arranged on the first conductive type semiconductor layer and connected to the first electrode pad,
    wherein the second electrode pad is insulated from the first semiconductor layer.

12. The light emitting diode of claim 11, wherein the at least one lower extension comprises a first lower extension extending along a periphery of the first conductive type semiconductor layer and a second lower extension extending along a substantially straight line between the first electrode pad and the second electrode pad.

13. The light emitting diode of claim 12, wherein the at least one upper extension comprises a first upper extension and a second upper extension,
    a portion of each of the first upper extension and the second upper extension extend away from the second electrode pad on either side of the second lower extension, and
    the portion of the first upper extension, the portion of the second upper extension, and the second lower extension are substantially parallel.

14. The light emitting diode of claim 11, wherein the at least one lower extension comprises a first lower extension extending in a substantially straight line away from the first electrode pad, and a second lower extension connected to an end of the first lower extension, the second lower extension comprising a substantially horseshoe shape.

15. The light emitting diode of claim 14, wherein the at least one upper extension comprises a first upper extension extending along a periphery of the second conductive type semiconductor layer, a second upper extension extending along a substantially straight line into a middle portion of the second conductive type semiconductor layer, and the second upper extension extends between separated end portions of the second lower extension.

16. The light emitting diode of claim 11, wherein the at least one lower extension comprises a first lower extension extending along a periphery of the first conductive type semiconductor layer and a second lower extension extending into a center portion of the light emitting diode.

17. The light emitting diode of claim 16, wherein the at least one upper extension comprises a first upper extension extending along a periphery of the second conductive type semiconductor layer, a second upper extension extending along a substantially straight line into a middle portion of the second conductive type semiconductor layer, the second lower extension extends between and end portion of the second upper extension and the first upper extension, and the second lower extension, the end portion of the second upper extension, and the first upper extension are substantially parallel.

\* \* \* \* \*